(12) United States Patent
Nakamura et al.

(10) Patent No.: US 9,096,139 B2
(45) Date of Patent: *Aug. 4, 2015

(54) POWER FEEDING CONTROL APPARATUS

(75) Inventors: Shinichi Nakamura, Tsu (JP); Kouji Kakiuchi, Tsu (JP); Tatsuya Mukai, Tsu (JP); Shiro Mori, Tsu (JP); Naoki Fukuo, Tsu (JP); Noboru Inagaki, Tsu (JP); Haruhiko Mihara, Tsu (JP); Koji Gamou, Tsu (JP); Takao Akioka, Tsu (JP); Syuichi Iha, Tsu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1260 days.

This patent is subject to a terminal disclaimer.

(21) Appl. No.: 12/975,605

(22) Filed: Dec. 22, 2010

(65) Prior Publication Data

US 2011/0148191 A1 Jun. 23, 2011

(30) Foreign Application Priority Data

Dec. 22, 2009 (JP) ................................ 2009-291461

(51) Int. Cl.
*B60L 3/04* (2006.01)
*B60L 11/18* (2006.01)
*B60L 3/00* (2006.01)

(52) U.S. Cl.
CPC ............ *B60L 11/1816* (2013.01); *B60L 3/0069* (2013.01); *B60L 3/04* (2013.01); *B60L 2230/16* (2013.01); *Y02T 10/7005* (2013.01); *Y02T 10/7088* (2013.01); *Y02T 90/128* (2013.01); *Y02T 90/14* (2013.01); *Y02T 90/163* (2013.01)

(58) Field of Classification Search
CPC ....................................................... B60L 3/04

USPC .................................. 307/9.1, 10.1; 320/109
See application file for complete search history.

(56) References Cited

U.S. PATENT DOCUMENTS 8,421,404 B2 * 4/2013 Nakamura et al. ............ 320/104
2010/0033140 A1 2/2010 Otake
2010/0194354 A1 8/2010 Gotou et al.

FOREIGN PATENT DOCUMENTS

| JP | H10-321116 | 12/1998 |
|----|------------|---------|
| JP | 2002-217245 | 8/2000 |
| JP | 2008/153173 | 12/2008 |
| JP | 2009-033790 | 2/2009 |
| JP | 200933789 | 2/2009 |

OTHER PUBLICATIONS

The English translations of Chinese Office Action and Australian Patent Examination Report.

* cited by examiner

*Primary Examiner* — Fritz M Fleming
(74) *Attorney, Agent, or Firm* — Bacon & Thomas, PLLC

(57) ABSTRACT

A power feeding control apparatus includes a housing for accommodating at least a relay unit which opens and closes power feeding lines, a control circuit for controlling the relay unit, a leakage current detection circuit for detecting leakage current in the electric vehicle and a power supply circuit for generating a control electric power. The apparatus further includes a power source side connector and a vehicle side connector. The leakage current detection circuit includes a zero current transformer through which the power feeding lines extend and is configured to detect leakage current based on unbalanced currents flowing through the power feeding lines. Lead plates constitute a part of the power feeding lines and pass through a central opening of the zero current transformer, and the zero current transformer includes a positioning member molded within the central opening to fix the positions of the lead plates.

5 Claims, 15 Drawing Sheets

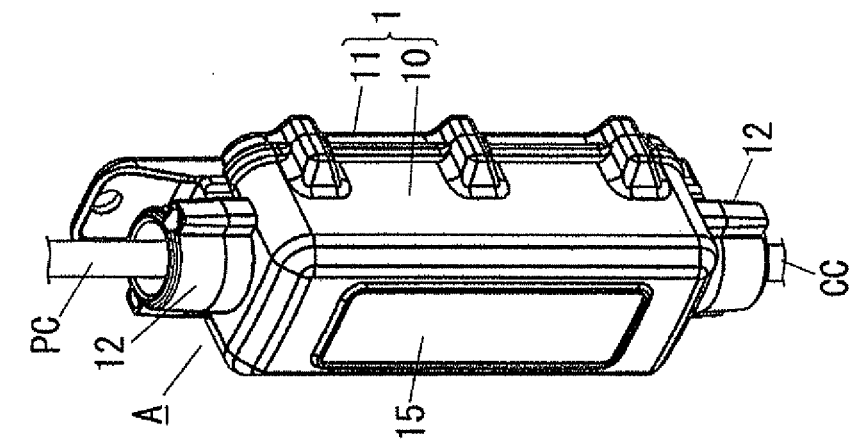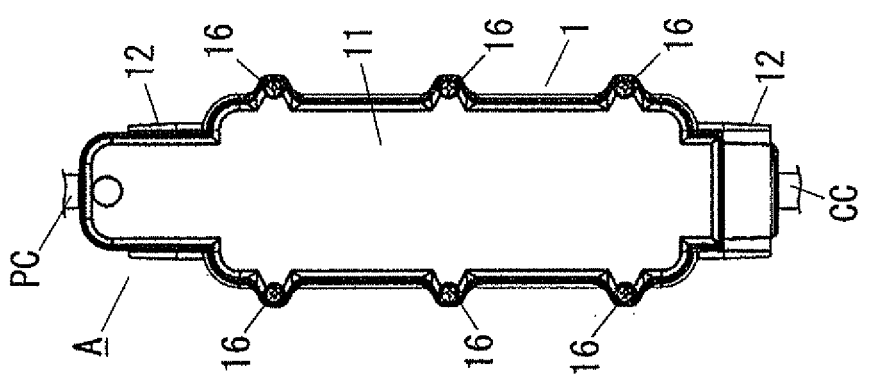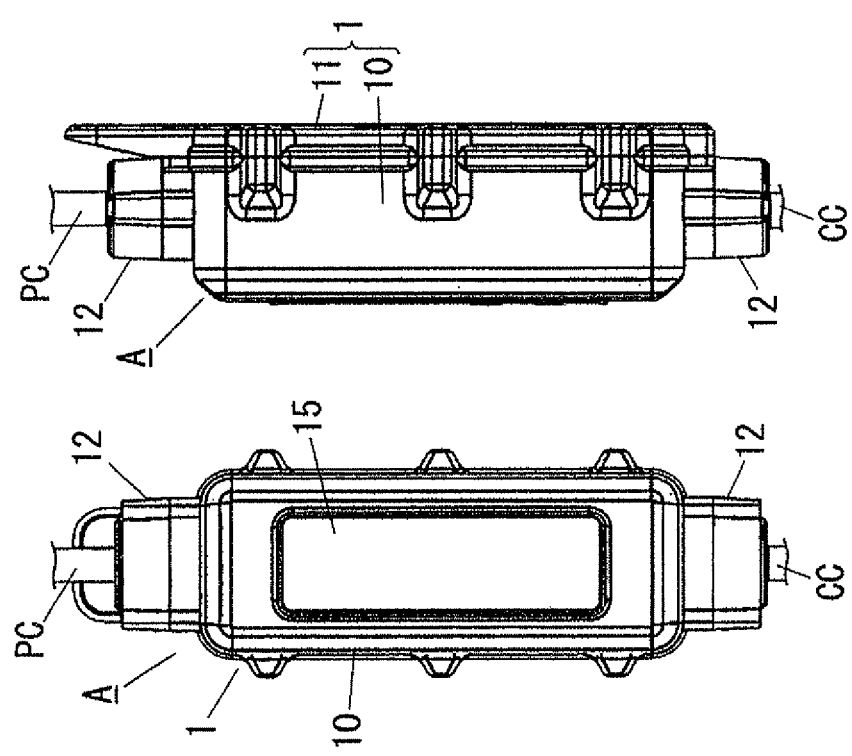

POWER FEEDING CONTROL APPARATUS

FIELD OF THE INVENTION

The present invention relates to a power feeding control apparatus.

BACKGROUND OF THE INVENTION

Conventionally, there is known a power feeding control apparatus for supplying electric power from an external power source to a battery provided in an electric vehicle such as a plug-in hybrid car or a battery-powered car (see, e.g., Japanese Patent Application Publication No. 2009-33789, Paragraphs [0015] through [0026] and FIGS. 1 through 4). The power feeding control apparatus includes a zero current transformer, through which power feeding lines extend, for detecting leakage current in the electric vehicle. The zero current transformer detects the leakage current based on unbalanced currents flowing through the power feeding lines to prevent occurrence of electric shock accidents.

In the power feeding control apparatus described above, lead lines constitute the power feeding lines extending through the zero current transformer. This makes it difficult to assemble the power feeding control apparatus since the lead lines may be bent while passing through a central opening of the zero current transformer.

SUMMARY OF THE INVENTION

In view of the above, the present invention provides a power feeding control apparatus capable of improving the ease of assembly.

In accordance with an embodiment of the present invention, there is provided a power feeding control apparatus for controlling electric power supplied from an external power source to an electric vehicle provided with a battery and a charging circuit for charging the battery, including: power feeding lines provided to supply the electric power from the external power source to the electric vehicle therethrough; a relay unit arranged on the power feeding lines to open and close the power feeding lines; a control circuit for controlling the relay unit; a leakage current detection circuit for detecting leakage current in the electric vehicle; a power supply circuit supplied with the electric power through the power feeding lines to generate a control electric power; a housing for accommodating at least the power feeding lines, the relay unit, the control circuit, the leakage current detection circuit and the power supply circuit; a power source side connector to be removably connected to a socket of the external power source; and a vehicle side connector to be removably connected to a power receiving connector of the electric vehicle.

Further, the leakage current detection circuit includes a zero current transformer through which the power feeding lines extend and is configured to detect leakage current based on unbalanced currents flowing through the power feeding lines. Lead plates constitute a part of the power feeding lines and the lead plates pass through a central opening of the zero current transformer. The zero current transformer includes a positioning member molded within the central opening to fix the positions of the lead plates.

In this configuration, insertion portions inserted into the central opening of the zero current transformer are formed of the lead plates, so that it becomes easy to pass through the central opening of the zero current transformer, as compared with the case where such insertion portions are formed of the lead lines. Further, the positions of the lead plates can be fixed by the positioning portions. This makes it easy to assemble the components of the power feeding control apparatus.

Further, the apparatus described above may further include a power feeding line block provided separately from a board on which the power supply circuit is mounted and a board on which the control circuit is mounted and having metal plates constituting the power feeding lines. The metal plates may be insertion-molded in the power feeding line block and the lead plates may be formed by having the metal plates, which are covered by a resin molding portion, partially protrude outwards beyond the resin molding portion.

In this configuration, the lead plates are integrally formed with the metal plates constituting the power feeding lines. This eliminates the need to provide the lead plates separately from the metal plates, so that the number of circuit components can be reduced. Further, it is possible to reduce the time required in welding the lead plates to the metal plates, which makes it easy to manufacture the power feeding control apparatus.

Further, the apparatus described above may further include a terminal block, to which a power source side cable is removably connected, for providing electric connection between the power source side cable and the power feeding lines. The terminal block may include terminal plates constitute the power feeding lines, and the lead plates may be formed from parts of the terminal plates.

In this configuration, since the terminal block and the zero current transformer are arranged in an overlapping relationship, it is possible to fit the terminal block and the zero current transformer in a compact manner, which assists in reducing the size of the housing.

Further, the apparatus described above may further include an additional terminal block, to which a vehicle side cable is removably connected, for providing electric connection between the vehicle side cable and the power feeding lines. The relay unit may be arranged on the power feeding lines in an overlapping relationship with the additional terminal block, and the additional terminal block may be connected to the power feeding lines of the vehicle side, the power feeding lines being electrically connected to one end of contact portion of the relay unit.

In this configuration, there is a need to provide the relay unit at the side of the power feeding control apparatus closer to the electric vehicle so that the control circuit can operate even if the relay unit is in an off-state. Since the relay unit is arranged in an overlapping relationship with the additional terminal block, it is possible to fit the relay unit in a compact manner, which assists in reducing the size of the housing.

BRIEF DESCRIPTION OF THE DRAWINGS

The objects and features of the present invention will become apparent from the following description of embodiments given in conjunction with the accompanying drawings, in which:

FIGS. 3A to 3D respectively show a front, a right side, a rear and a perspective view of the power feeding control apparatus;

DETAILED DESCRIPTION OF THE PREFERRED EMBODIMENTS

An embodiment of a power feeding control apparatus in accordance with the present invention will be described with reference to the accompanying drawings which form a part hereof.

Figure 4:
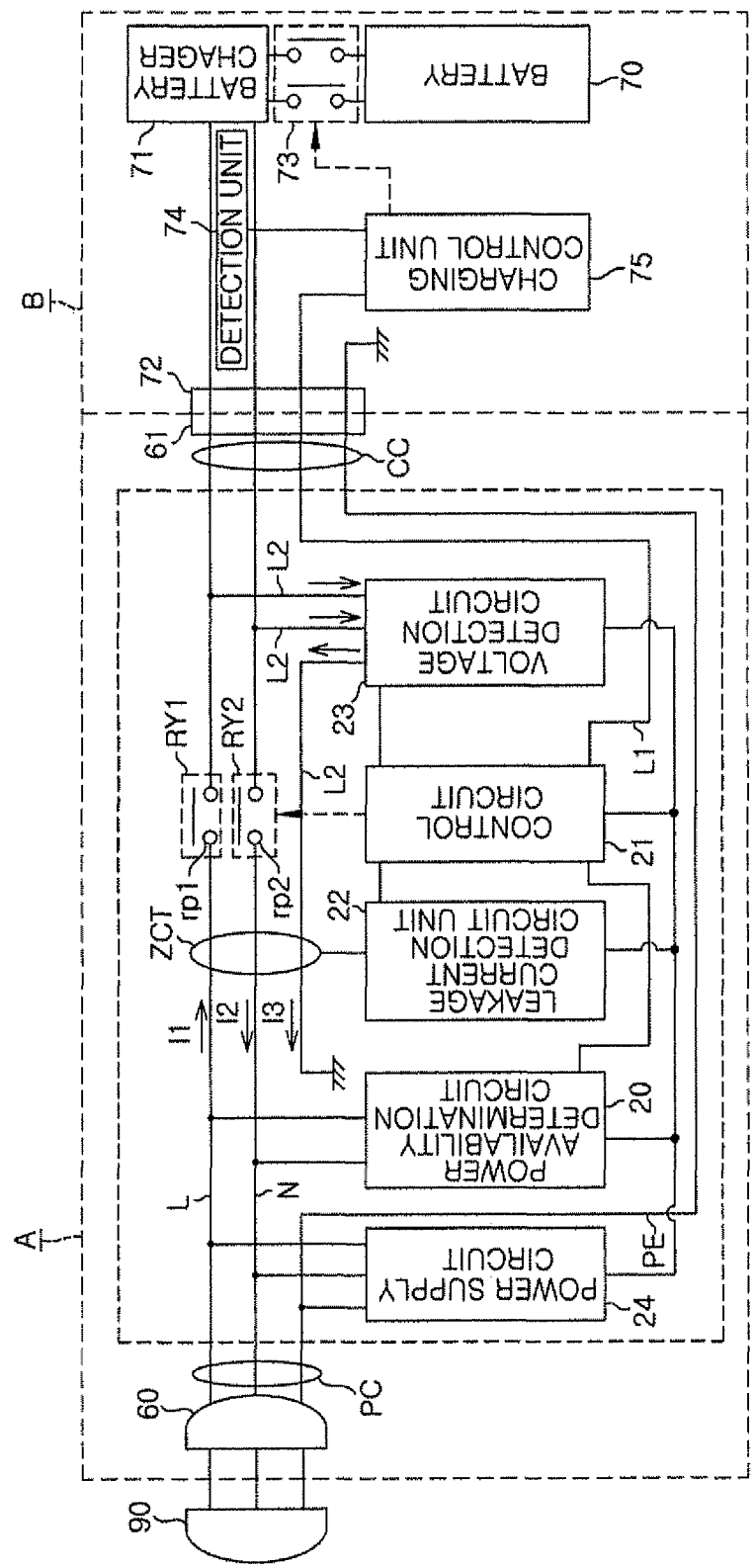
FIG. 4 is a schematic diagram showing a circuit employed in the power feeding control apparatus.

As shown in FIG. 4, the power feeding control apparatus A of the present embodiment is connected to a plug 60 removably connected to a power outlet socket 90 supplying the electric power of an external power source, e.g., a commercial AC power source, and a connector 61 connected to an electric vehicle B through cables PC and CC, respectively. The power feeding control apparatus A controls the electric power supplied from the external power source to the electric vehicle B. The power feeding control apparatus A is used to supply or interrupt the electric power supplied to a charging circuit for charging a battery 70 provided in the electric vehicle B such as a battery-powered car or a plug-in hybrid car. Unless otherwise specifically mentioned in the following description, the up-down and left-right directions will be defined based on FIG. 3A and the left-right direction in FIG. 3B will be referred to as front-rear direction. However, these directions are defined merely for the sake of convenience in description and, therefore, may not coincide with the directions when the power feeding control apparatus A is actually used. The solid line arrows indicated in FIG. 4 show the current flowing directions. However, the current flowing directions are changed alternately over time because the current flowing through the power feeding lines L and N is an alternating current.

FIG. 4 is a schematic circuit diagram of the power feeding control apparatus A of the present embodiment and the electric vehicle B.

The electric vehicle B includes a battery 70 composed of, e.g., lithium ion cells and provided to supply electric power to a motor (not shown) serving as a drive power source; a battery charger 71 for charging the battery 70 with the DC power converted from the AC power which is supplied from the external commercial AC power source through the power feeding control apparatus A; a connector 72 for connecting the battery charger 71 to the power feeding control apparatus A; a relay 73 arranged in the charging path extending from the battery charger 71 to the battery 70; a detection unit 74 for detecting the AC power supplied to the battery charger 71; and a charging control unit 75 for on-off controlling the relay 73 based on the detection result of the detection unit 74. When the AC power is detected by the detection unit 74, the charging control unit 75 turns on (or closes) the relay 73 so that the battery charger 71 can charge the battery 70. When the AC power is not detected by the detection unit 74, the charging control unit 75 turns off (or opens) the relay 73 so that the battery charger 71 can stop charging the battery 70.

The power feeding control apparatus A includes the plug having a ground terminal (i.e., a power source side connector part) 60 removably connected to the power outlet socket 90 of the external power source such as a commercial AC power source or the like; the connector (i.e., a vehicle side connector part) 61 connected to the connector 72 of the electric vehicle B; and power feeding lines L and N and a ground line PE arranged between the plug 60 and the connector 61.

In addition to the power feeding lines L and N and the ground line PE, a signal line L1 for sending and receiving signals to and from the charging control unit 75 of the electric vehicle B therethrough is connected to the connector 61. Normally open relays RY1 and RY2 are arranged in the power feeding lines L and N, respectively. Branch lines L2 are branched from the power feeding lines L and N between the relays RY1 and RY2 and the connector 61. The power feeding lines L and N pass through a zero current transformer (ZCT) between the relays RY1 and RY2 and the plug 60.

The signal line L1 is used for the electric vehicle B to transmit a state notifying signal (a so-called "CPLT signal") therethrough. Based on the state notifying signal, the power feeding control apparatus A can determine whether the electric vehicle B is in a disconnected state (a state in which the electric vehicle is not connected to the power feeding control apparatus), a charging standby state (a state in which the power feeding to the electric vehicle is stopped), a charging-permitted state (a state in which the electric power is being supplied to the electric vehicle) or a state in which the electric power is not usable.

The power feeding control apparatus A further includes a power availability determination circuit 20 connected to the power feeding lines L and N between the ZCT and the plug 60; a control circuit 21 connected to the electric vehicle B through the signal line L1 for on-off controlling the relays RY1 and RY2 in response to the state notifying signal (CPLT signal) transmitted from the electric vehicle B through the signal line L1; a leakage current detection circuit 22 for detecting leakage current by having the ZCT detect the unbalanced current flowing through the power feeding lines L and N and for causing the control circuit 21 to turn off the relays RY1 and RY2 when the leakage current is detected; a voltage detection circuit 23 arranged on the branch lines L2 that detects the voltages of the power feeding lines L and N between the relays RY1 and RY2 and the connector 61 from the currents flowing through the branch lines L2; and a power supply circuit 24 for supplying a control electric power to the circuits 20 to 23.

The branch lines L2 are branched from the power feeding lines L and N at branch points thereof between the relays RY1 and RY2 and the electric vehicle B and opposite end portions of the branch lines L2 (which are merged into a single branch line L2 in this example) away from the branch points are grounded. The branch lines L2 are inserted into the ZCT in such a direction that the branch points where the branch lines L2 are branched from the power feeding lines L and N are positioned at the electric vehicle B side while the grounded end of the branch lines L2 are positioned at the power source side. Thus, an electric current I3 flows through the part of the branch lines L2 inserted into ZCT in the same direction as the flowing direction of an electric current I2 returned from the electric vehicle B to the power source through the power feeding lines L or N.

Figure 2:
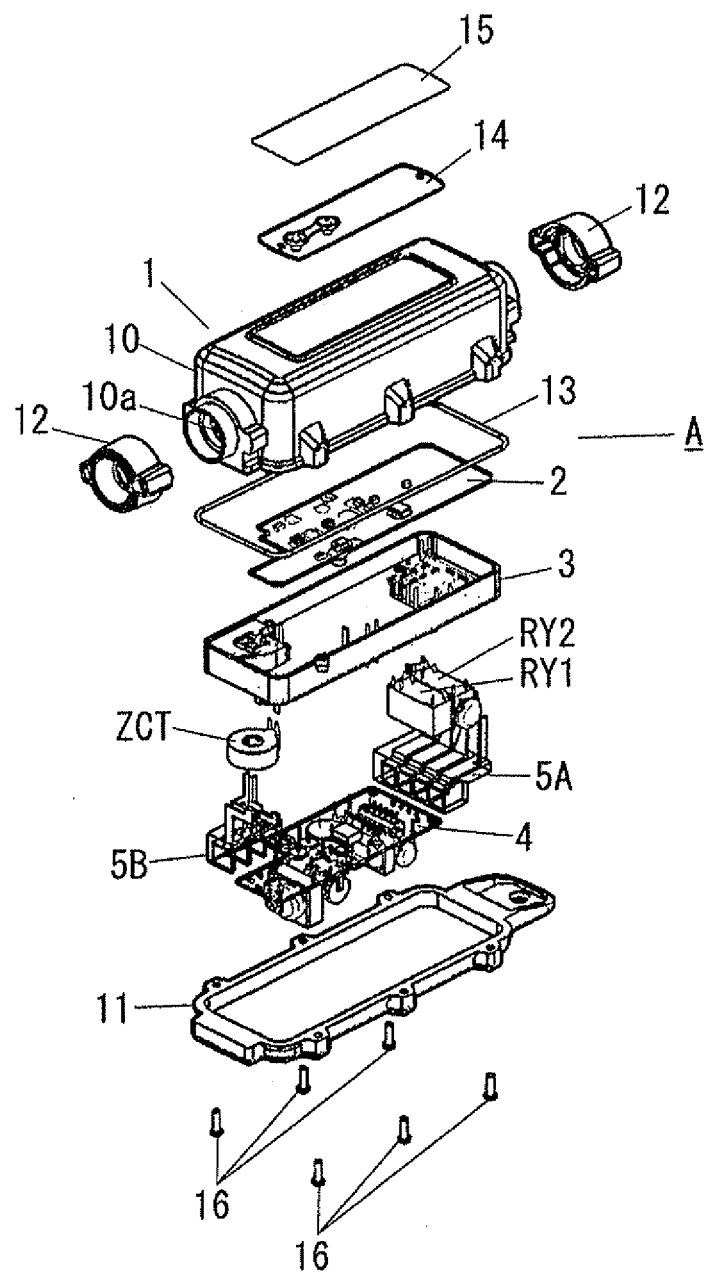
FIG. 2 is an exploded perspective view showing a power feeding control apparatus in accordance with an embodiment of the present invention.

FIG. 2 is an exploded perspective view showing the power feeding control apparatus A of the present embodiment. The power feeding control apparatus A includes a housing (main body housing part) 1 of elongated rectangular solid shape. The housing 1 includes a body 10 formed into a box-like shape with an open rear surface (lower surface in FIG. 2) and made from a synthetic resin molding; and a flat rear cover 11 provided to close the opening of the body 10 and made from a synthetic resin molding. The body 10 and the rear cover 11 are combined together by using fixing screws 16.

Cable insertion holes 10a through which to insert cables PC and CC are formed in the vertical opposite end portions of the body 10 (Only the lower one of the cable insertion holes 10a is shown in FIG. 2). Caps 12 are attached to the vertical opposite end portions of the body 10 after the cables PC and CC have been inserted into the cable insertion holes 10a (see FIGS. 3A to 3D). The caps 12 are attached so that they can cover gaskets (not shown) made of a pliant material, e.g., ethylene propylene rubber. The gaskets hold the cables PC and CC in place and provide waterproof sealing of the housing 1. An O-ring 13 is arranged between the body 10 and the rear cover 11 to seal the gap between the body 10 and the rear cover 11.

Accommodated within the housing 1 are: a power supply PCB (printed circuit board) 4 mounted with circuit components (e.g., transformers, capacitors and the like) making up the voltage detection circuit 23 and the power supply circuit 24; a control PCB 2 mounted with circuit components making up the power availability determination circuit 20, the control circuit 21 and the leakage current detection circuit 22; the ZCT; the relays RY1 and RY2; terminal blocks 5A and 5B; and a bus bar block (power feeding line block) 3 making up the power feeding lines L and N, the ground line PE and the signal line L1, as shown in FIG. 2.

A transparent cover 14 with a light transmitting property is arranged on the front surface of the housing 1. A label 15 is bonded to the front surface of the transparent cover 14. Mounted to the front surface (upper surface in FIG. 2) of the control PCB 2 are a power connection indication lamp to be turned on when the electric power is supplied from the external power source to the power feeding control apparatus A; an error indication lamp to be turned on when detecting an error (e.g., contact adhesion) in the relays RY1 and RY2 is detected; a test button for used in testing the power interruption operation to be performed at the occurrence of leakage current and a reset button for use in performing the reset operation making an open state of the relays RY1 and RY2. Letters and/or symbols indicative of the usage or functions of the corresponding lamps and buttons are provided in the labels 15. For example, other area than the letters and/or symbols in the label 15 are transparent to enable the user to see the lamps and manipulate the buttons.

Figure 6A:
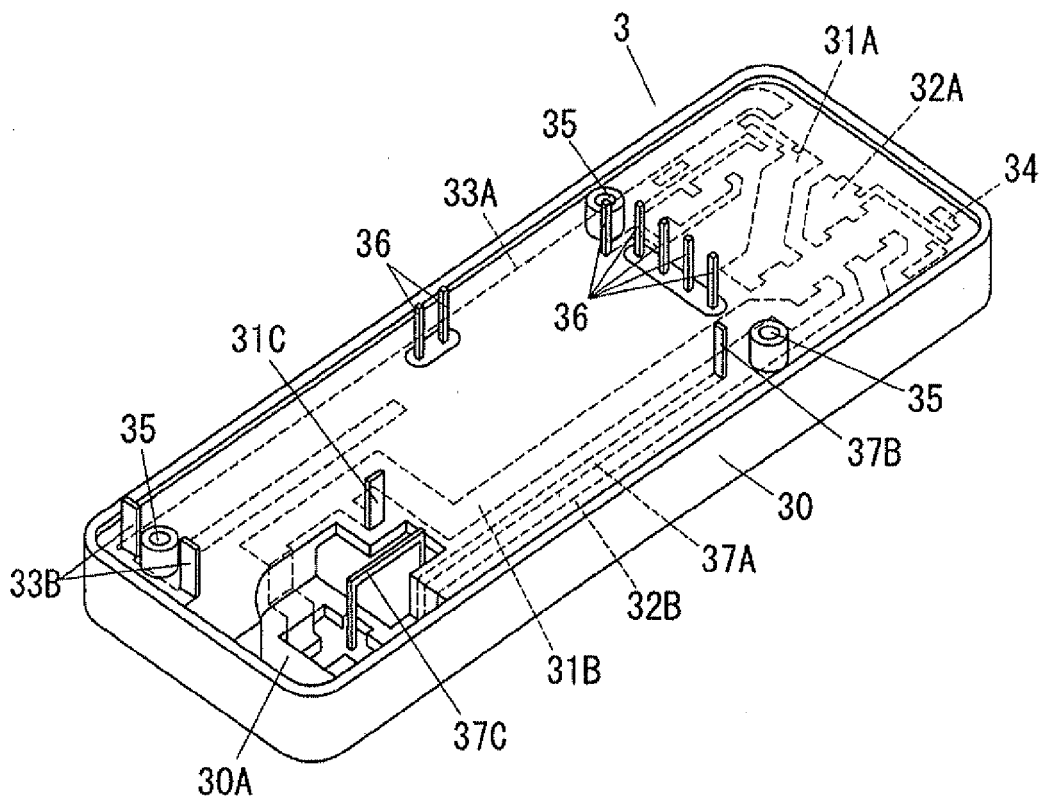
FIGS. 6A and 6B respectively show a perspective and a partial section view of the bus bar block employed in the power feeding control apparatus.
Figure 6B:
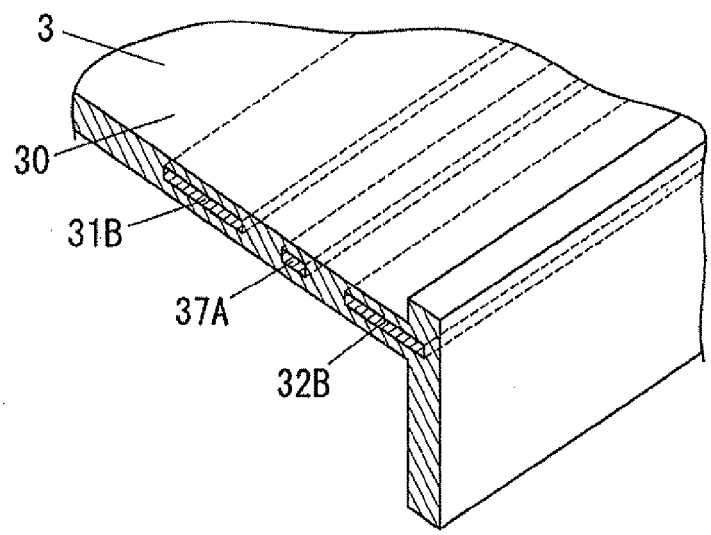
Figure 7:
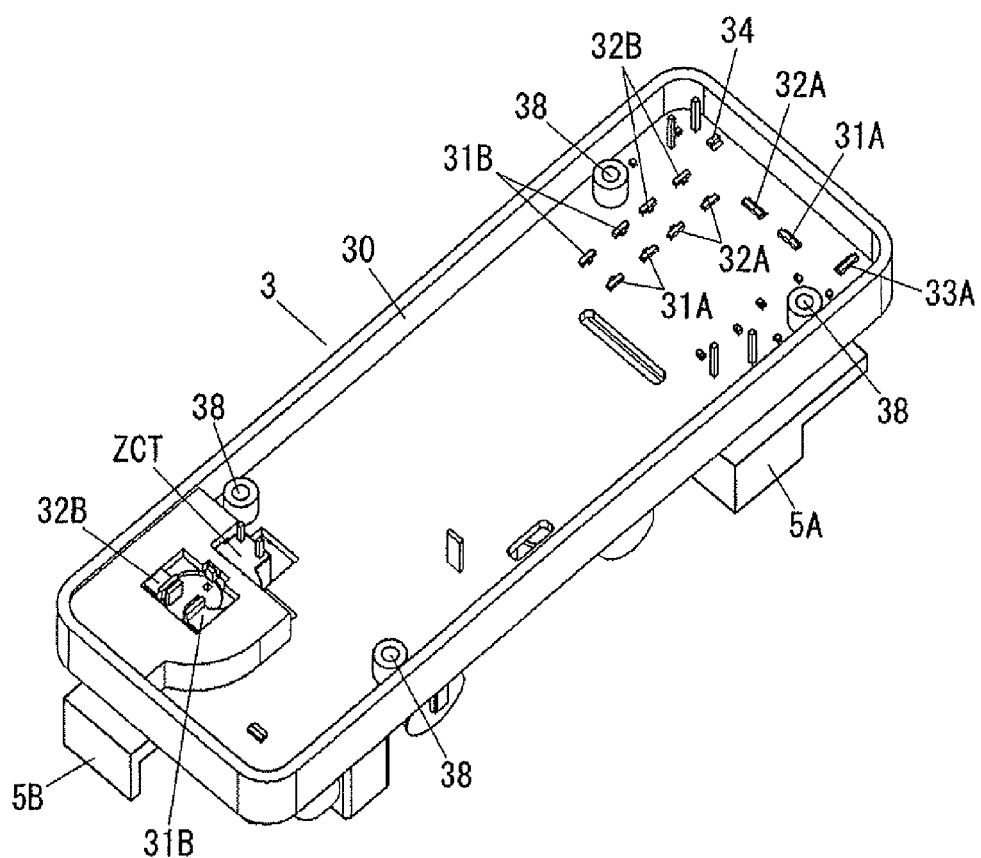
FIG. 7 is a front perspective view showing the bus bar block employed in the power feeding control apparatus.

FIG. 6A is a perspective view showing the bus bar block 3 and FIG. 6B is a partial section view thereof. FIG. 7 is a front perspective view showing the bus bar block 3 and FIG. 8 is a layout diagram showing the bus bars of the bus bar block 3.

Figure 8:
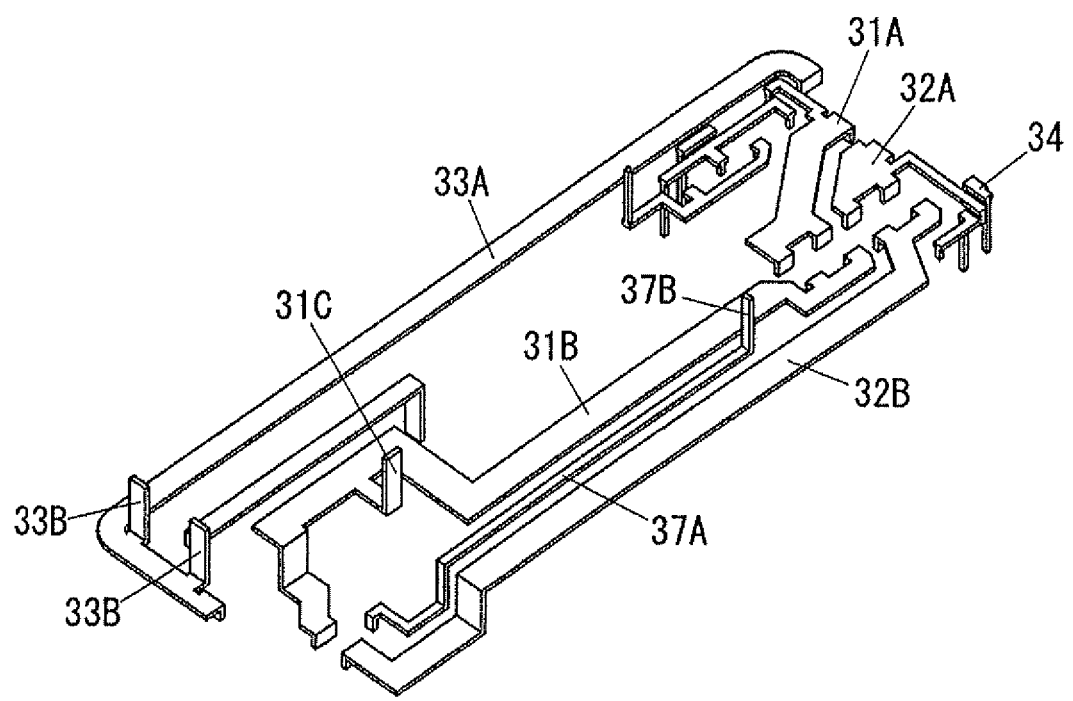
FIG. 8 is a layout diagram showing the bus bars of the bus bar block employed in the power feeding control apparatus.

As shown in FIG. 8, the bus bar block 3 includes, as its main components, bus bars 31A and 31B making up the power feeding line L; bus bars 32A and 32B making up the power feeding line N; a bus bar 33A making up the ground line PE; a bus bar 34 making up the signal line L1; and a bus bar 37A making up the branch lines L2. Each of the bus bars 31A, 31B, 32A, 32B, 33A, 34 and 27A is made from a highly electrically conductive metal plate, e.g., copper plate. The bus bar block 3 is formed into a longitudinally elongated rectangular plate shape by an insertion-molding method in which the respective bus bars are used as insertion members (see FIGS. 6A and 6B).

Figure 5:
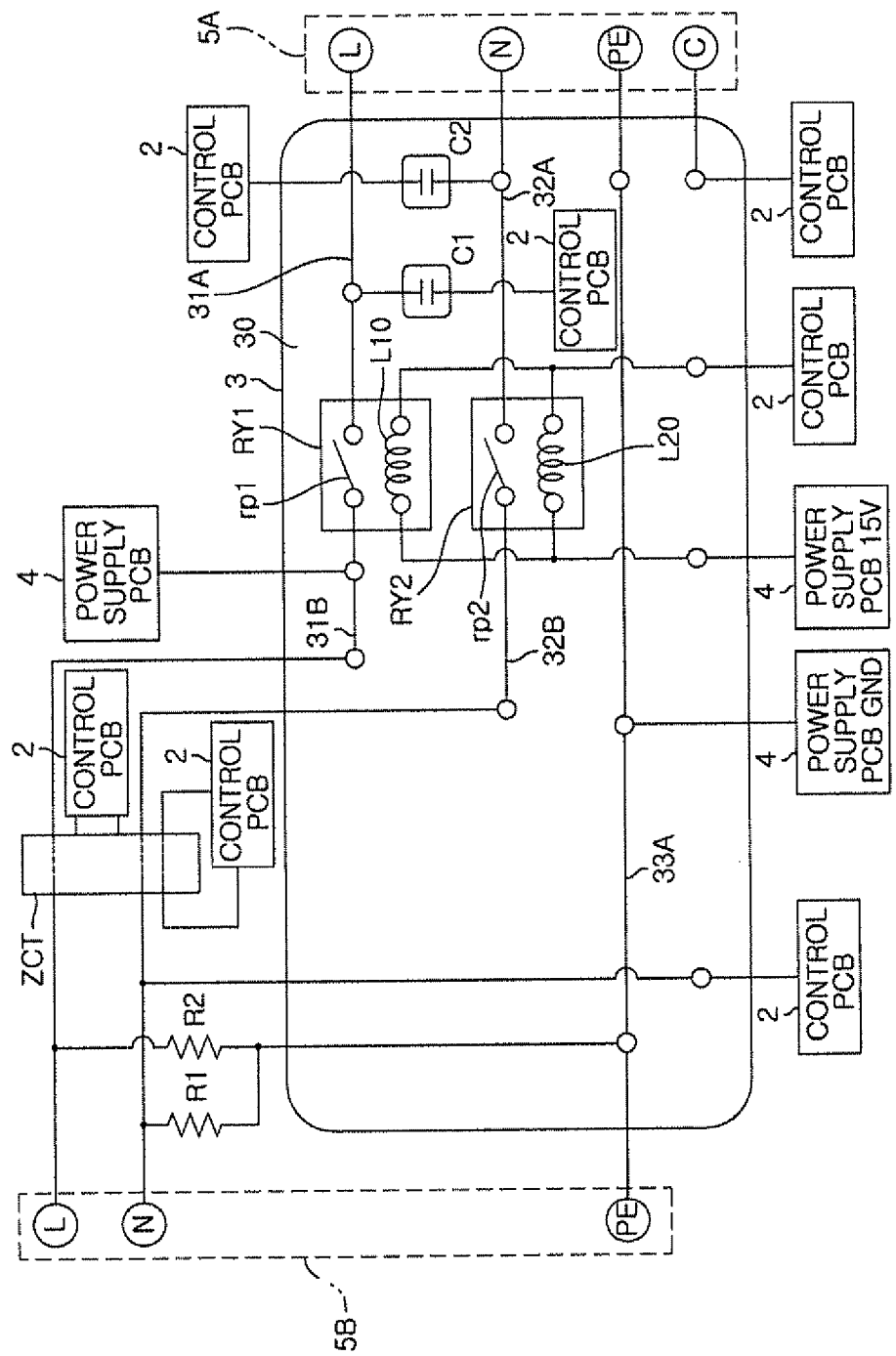
FIG. 5 is a schematic circuit diagram showing a bus bar block employed in the power feeding control apparatus.

FIG. 5 is a schematic circuit diagram showing the bus bar block 3. The bus bar 31A provides electric connection between one end of the switch contact portion rp1 of the relay RY1 and the terminal block 5A, while the bus bar 31B provides the electric connection between the other end of the switch contact portion rp1 of the relay RY1 and the terminal block 5B. The bus bar 32A provides electric connection between one end of the switch contact portion rp2 of the relay RY2 and the terminal block 5A, while the bus bar 32B provides electric connection between the other end of the switch contact portion rp2 of the relay RY2 and the terminal block 5B.

Therefore, when the relays RY1 and RY2 are turned on (i.e., closed), the bus bars 31A and 31B are electrically connected to each other and the bus bars 32A and 32B are electrically connected to each other, consequently supplying electric power to the electric vehicle B. Reference characters L10 and L20 in FIG. 5 designate coils for driving the relays RY1 and RY2. A specified DC electric power (e.g., a DC 15V) is supplied from the power supply PCB 4 to the coils L10 and L20. The respective contact portions rp1 and rp2 are connected or disconnected by supplying or interrupting the DC electric power in response to the control signal outputted from the control PCB 2.

A lead plate 31C, which is a part of the bus bar 31B, protruding upwards beyond a resin molding portion 30 and lead plates 33B, which are a part of the bus bar 33A, protruding upwards beyond the resin molding portion 30 are formed on the rear surface of the bus bar block 3 (the upper surface in FIG. 6A). The lead plates 31C and 33B are electrically connected to the input terminals of the power supply circuit 24. Moreover, a lead plate 37B, which is a part of the bus bar 37A, protruding upwards beyond the resin molding portion 30 is formed on the rear surface of the bus bar block 3. The lead plate 37B is electrically connected to the output terminal of the voltage detection circuit 23.

In addition, a plurality of (seven in the example of FIG. 6A) joint pins 36 for providing electric connection between the control PCB 2 and the power supply PCB 4 is formed to pass through the resin molding portion 30 in the front-rear direction. Boss portions 35, to which screws for fixing the power supply PCB 4 are to be threadedly coupled, are formed at three specified points on the rear surface of the bus bar block 3. A recess portion 30A for accommodating the ZCT is formed in the right lower portion of the bus bar block 3 in FIG. 6A. Boss portions 38, to which screws for fixing the control PCB 2 are to be threadedly coupled, are formed at four specified points on the front surface of the bus bar block 3 (the upper surface in FIG. 7).

Next, the order of assembling the control PCB 2, the bus bar block 3 and the power supply PCB 4 will be described with reference to FIGS. 9 through 11.

Figure 9:
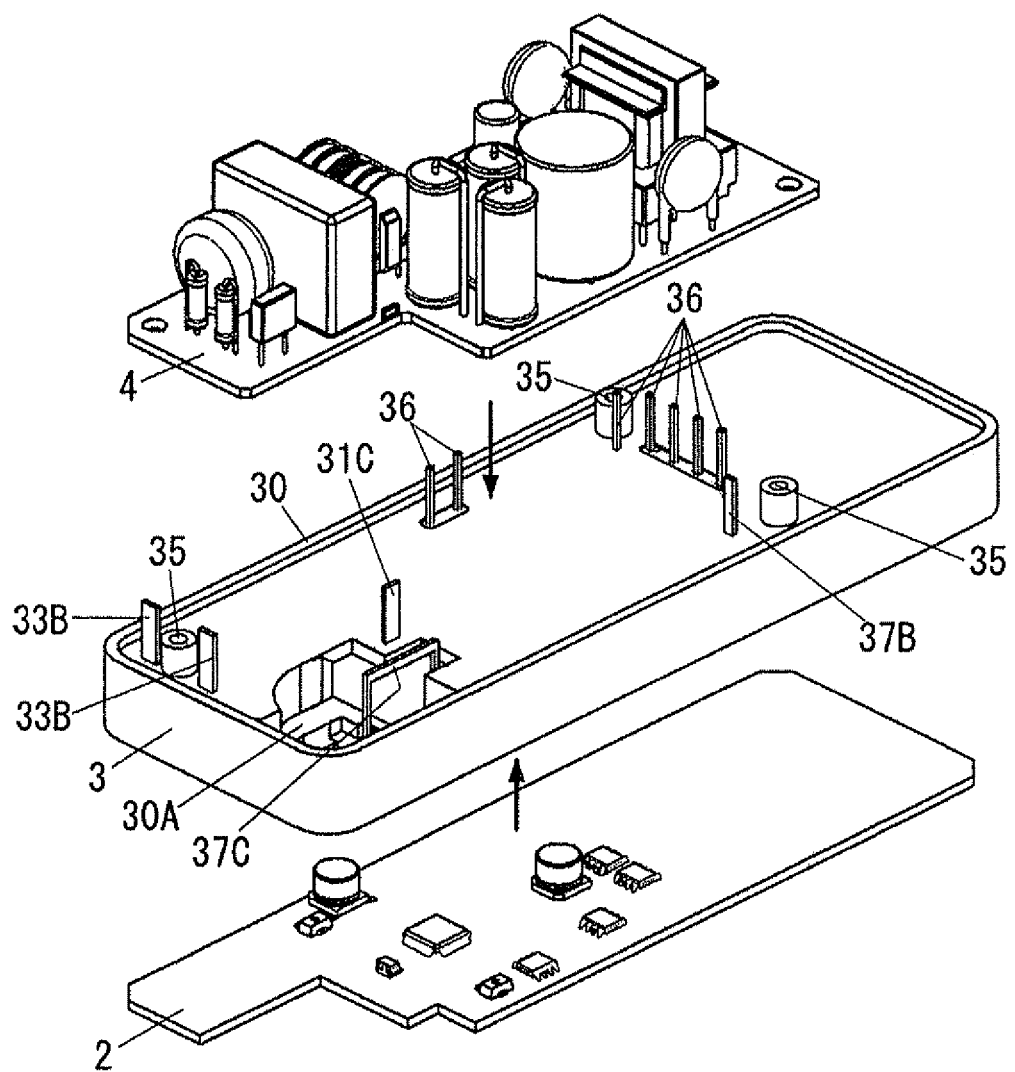
FIG. 9 is a view for explaining the order of fixing the power supply PCB, the bus bar block and the control PCB employed in the power feeding control apparatus.
Figure 10:
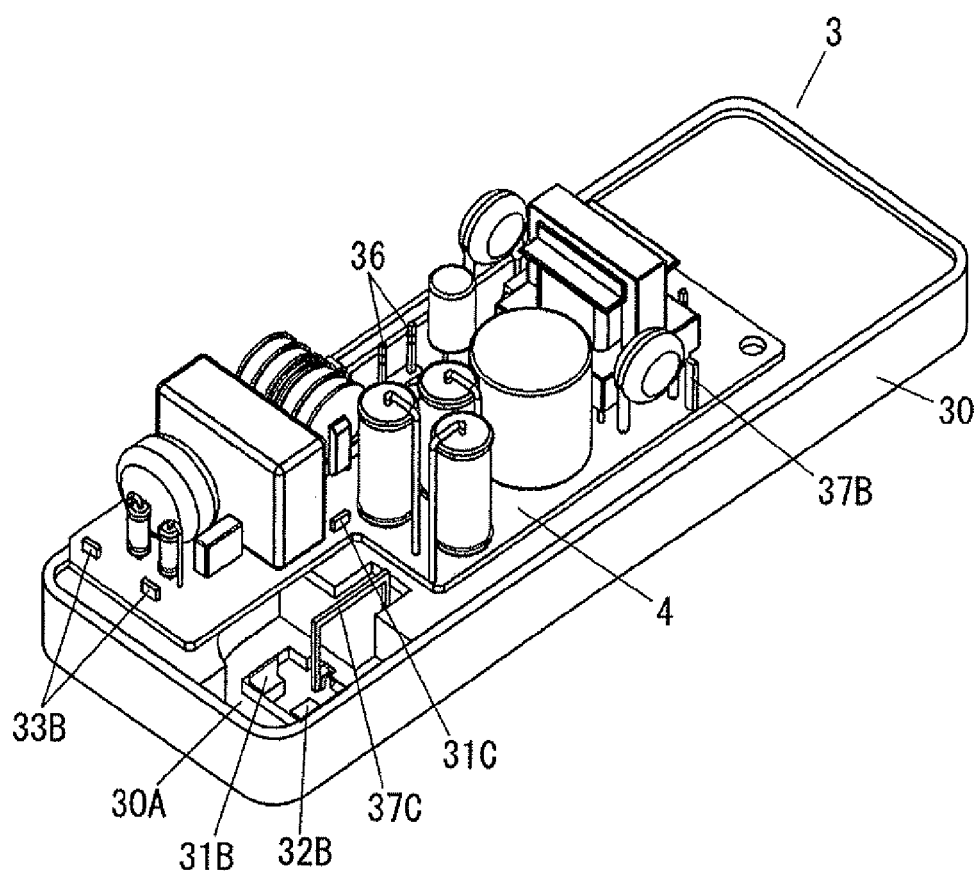
FIG. 10 is a perspective view showing the power supply PCB, the bus bar block and the control PCB of the power feeding control apparatus fixed together.

Referring to FIG. 9, circuit components making up the voltage detection circuit 23 and the power supply circuit 24, e.g., transformers, capacitors and the like, are mounted on the rear surface (the upper surface in FIG. 9) of the power supply PCB 4. The power supply PCB 4 is fixed to the bus bar block 3 by screws in such a state that the front surface (the lower surface in FIG. 9), on which no circuit components are mounted, of the power supply PCB 4 is placed to face the rear surface (the upper surface in FIG. 9) of the bus bar block 3. The lead plates 31C, 33B and 37B and the joint pins 36 extend through the corresponding through-holes (not shown) formed in the power supply PCB 4 and are electrically and mechanically connected to the power supply PCB 4 by, e.g., soldering.

Figure 11A:
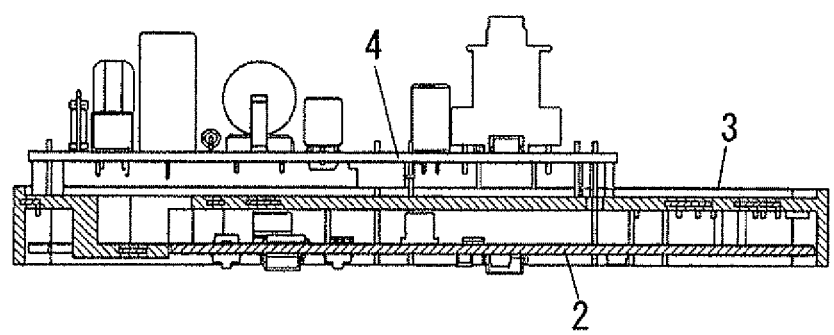
FIG. 11A is a side section view showing the power supply PCB, the bus bar block and the control PCB of the power feeding control apparatus fixed together.

The control PCB 2 is fixed to the front surface (the lower surface in FIG. 9) of the bus bar block 3 by screws. In other words, the bus bar block 3 is interposed between the power supply PCB 4 and the control PCB 2 in the present embodiment. FIGS. 10 and 11A respectively show a perspective view and a side view showing the control PCB 2, the bus bar block 3 and the power supply PCB 4 fixed together. The assembly formed of the control PCB 2, the bus bar block 3 and the power supply PCB 4 is accommodated within the body 10 of the housing 1 in such a state that the upper side thereof in FIG. 11A faces toward the rear cover 11.

Figure 1:
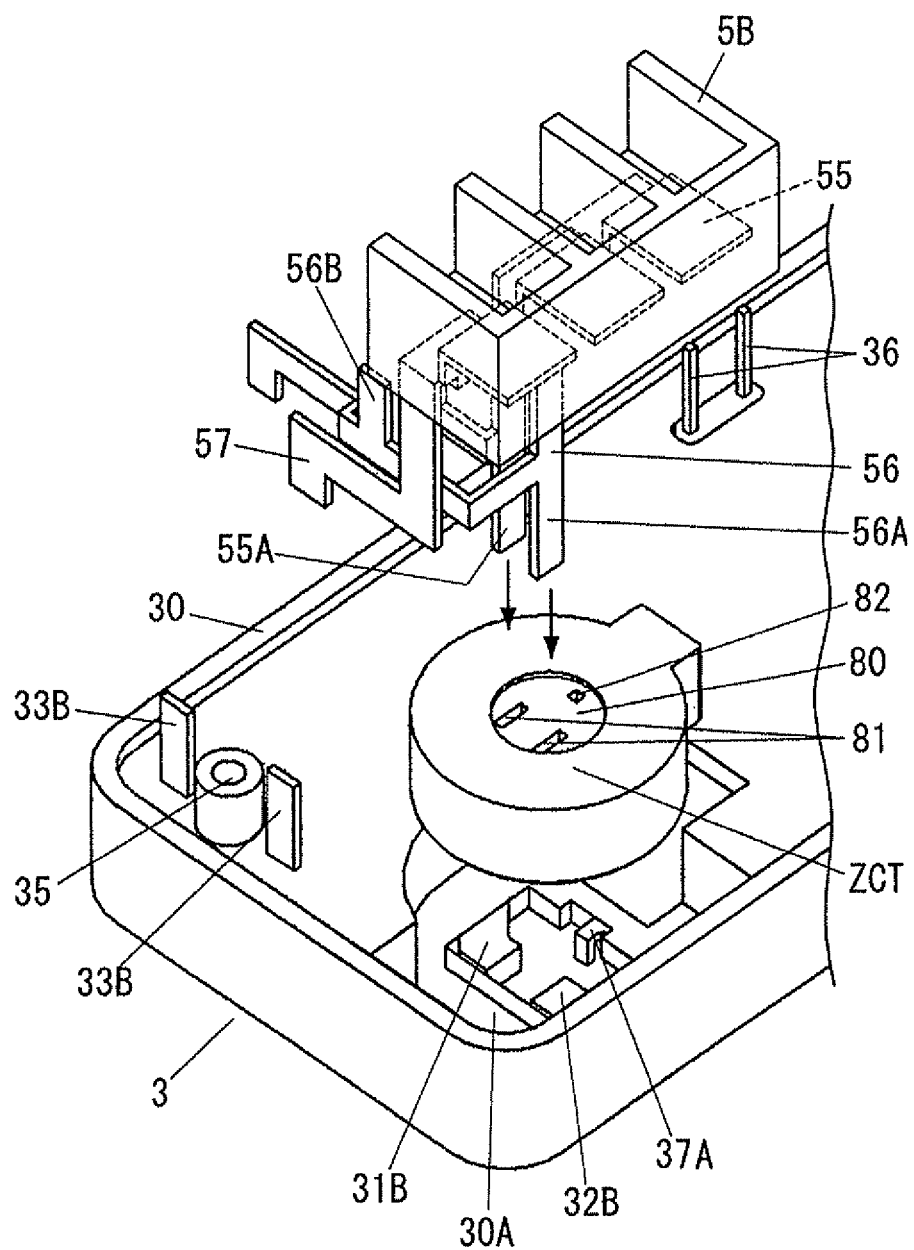
FIG. 1 is a view for explaining the order of fixing the zero current transformer and the power source side terminal block to the bus bar block of the power feeding control apparatus in accordance with an embodiment of the present invention.

In the present embodiment, as shown in FIG. 1, the terminal block 5B, to which the cable PC provided with the plug 60 can be removably connected, is arranged for providing electric connection between the cable PC and the power feeding lines L and N and the ground line PE. The terminal block 5B includes terminal plates 55, 56 and 57 electrically connected to the power feeding lines L and N and the ground line PE, respectively. Each of the terminal plates 55, 56 and 57 is made from a highly electrically conductive metal plate (e.g., a copper plate). In particular, the terminal plates 55 and 56 connected to the power feeding lines L and N are respectively provided with lead plates 55A and 56A integrally formed therewith and inserted into a central opening of the ZCT. The terminal plate 56 is provided with a lead plate 56B integrally formed therewith and electrically connected to the input terminal of the power supply circuit 24.

Figure 12A:
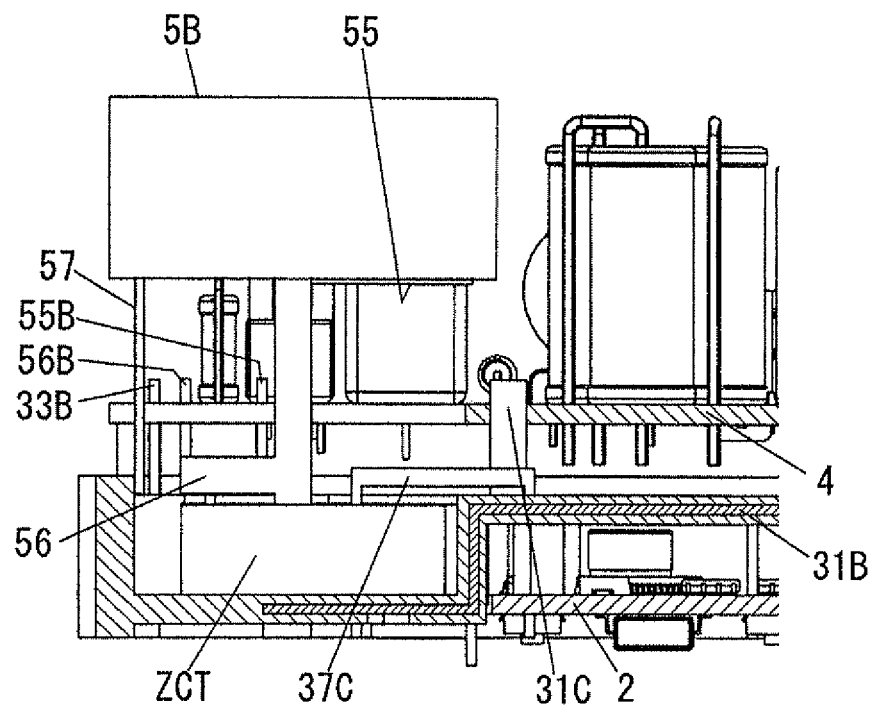
FIGS. 12A and 12B respectively show a side section and a perspective section view of the power feeding control apparatus in a state where the zero current transformer and the power source side terminal block are fixed to the bus bar block.
Figure 12B:
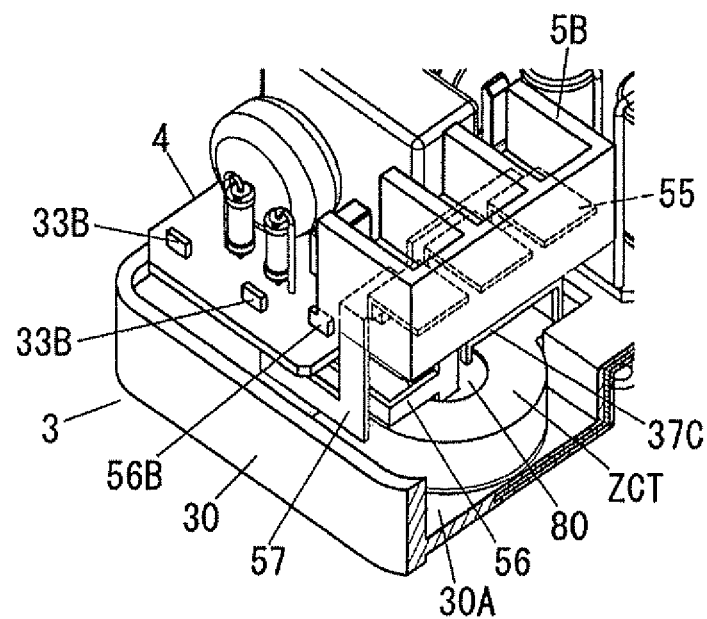

Molded in the central opening of the ZCT is a positioning portion 80 that has a pair of insertion holes 81 and 82 through which to insert the lead plates 55A and 56A and an insertion hole 82 through which to insert the bus bar 37C (see FIG. 6A) making up a portion of the branch line L2. The ZCT is then placed within the recess portion 30A of the bus bar block 3. Thereafter, the positions of the terminal block 5B and the bus bar 37C are determined as illustrated in FIGS. 12A and 12B when the lead plates 55A and 56A of the terminal plates 55 and 56 are inserted downward in FIG. 1 into the corresponding insertion holes 81 to pass therethrough, and the tip end portion of the bus bar 37C is inserted into the insertion hole 82 to pass therethrough. The lead plate 55A is electrically connected at its tip end to the bus bar 31B by welding, soldering or the like. Similarly, the lead plate 56A is electrically connected at its tip end to the bus bar 32B by welding, soldering or the like. Moreover, the bus bar 37C is electrically connected at one end to the bus bar 37A by welding or the like and at the other end to the control PCB 2.

Figure 13A:
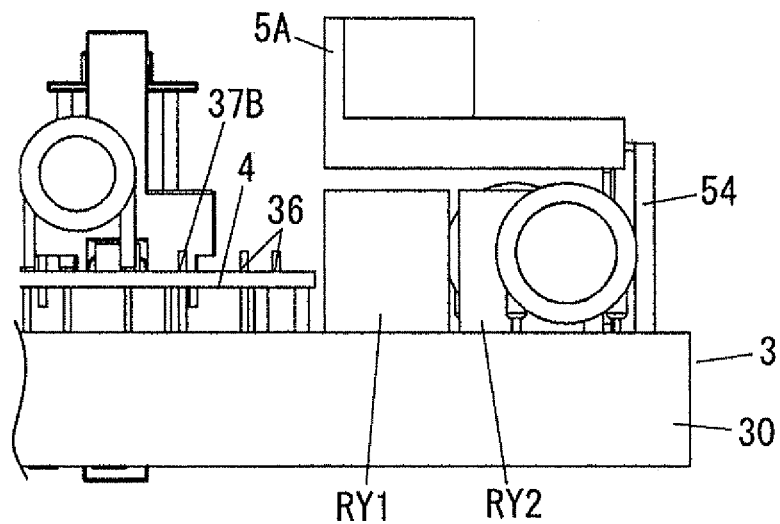
FIGS. 13A and 13B respectively show a side and a perspective view of the power feeding control apparatus in a state where the relay and the vehicle side terminal block are fixed to the bus bar block.
Figure 13B:
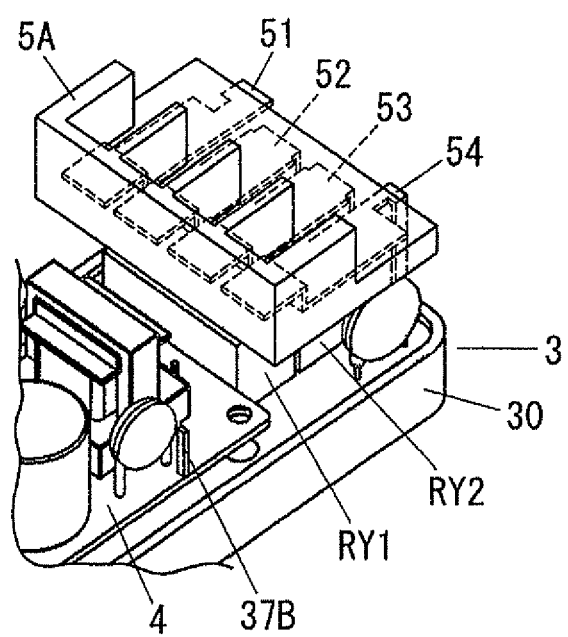

In the present embodiment, as shown in FIGS. 13A and 13B, the terminal block 5A, to which the cable CC provided with the plug 60 can be removably connected, is arranged for providing electric connection between the cable CC and the power feeding lines L and N, the ground line PE and the signal line L1. The terminal block 5A includes terminal plates 51 to 54 electrically connected to the ground line PE, the power feeding lines L and N and the signal line L1, respectively.

Figure 14:
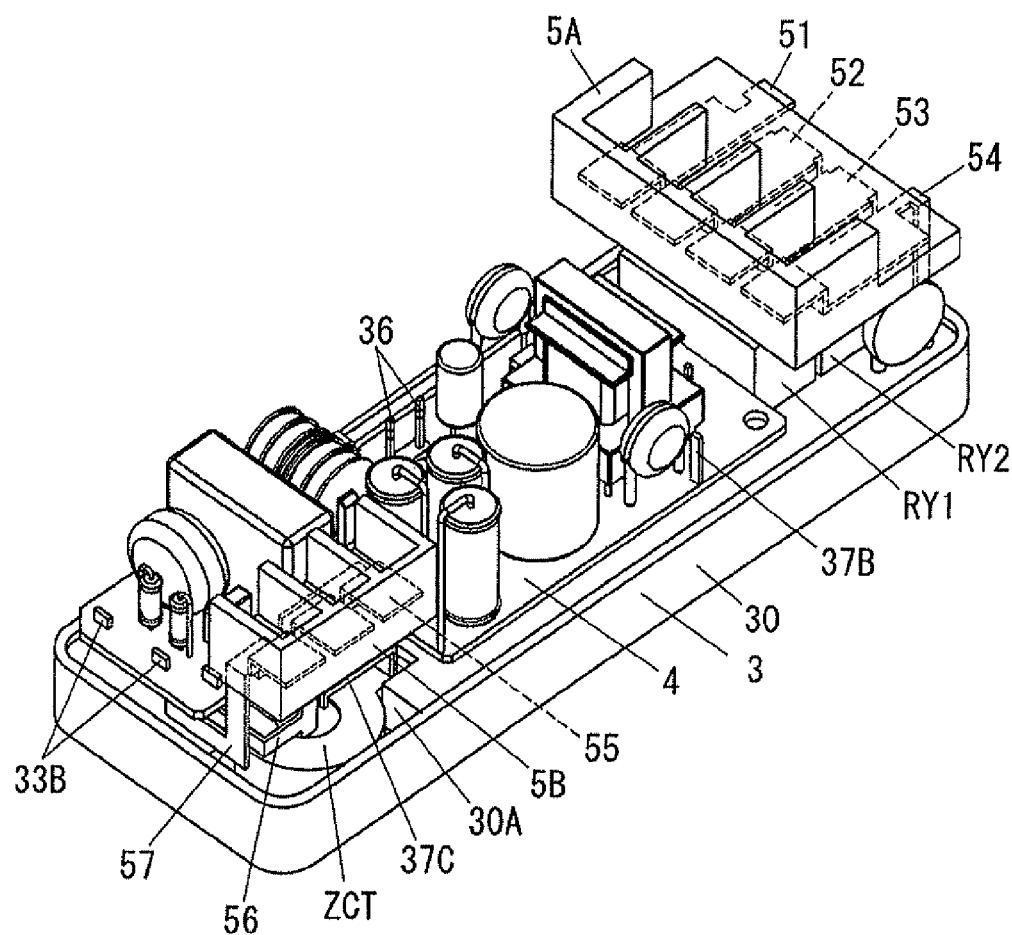
FIG. 14 is a perspective view showing the power supply PCB, the bus bar block, the control PCB and the terminal blocks of the power feeding control apparatus fixed together.

The terminal block 5A is fixed to the bus bar block 3. In the present embodiment, the relays RY1 and RY2 are arranged in the space between the terminal block 5A and the bus bar block 3 in the thickness direction of the bus bar block 3 (the up-down direction in FIG. 13A). In other words, the terminal block 5A and the relays RY1 and RY2 are arranged in an overlapping relationship with each other along the thickness direction of the bus bar block 3. FIG. 14 is a perspective view showing the control PCB 2, the bus bar block 3, the power supply PCB 4, the ZCT and the terminal blocks 5A and 5B, all of which are fixed together. In the present embodiment, electric power is supplied to the power supply PCB 4 through the lead plates 31C (see FIG. 9) and 56B (see FIG. 1). Further, the bus bars 31A and 31B, the bus bars 32A and 32B in the bus bar block 3, the terminal plates 55 and 56 and the terminal plates 52 and 53 constitute the power feeding lines L and N.

Next, the operations of the power feeding control apparatus A and the electric vehicle B when starting to charge the battery 70 of the electric vehicle B will be described with reference to FIG. 4. If the plug 60 is connected to the socket 90 of the external power source with the connector 61 connected to the connector 72 of the electric vehicle B, an electric potential difference is generated between the power feeding lines L and N extending between the relays RY1 and RY2 and the power source (at the left side of the relays RY1 and RY2 in FIG. 4). If the power availability determination circuit 20 detects the generation of the electric potential difference for a specified period of time, it determines that the plug 60 has been connected to the socket 90 and transmits a determination signal to the control circuit 21. The determination signal continues to be transmitted as long as the plug 60 remains connected to the socket 90.

Responsive to the determination signal sent from the power availability determination circuit 20, the control circuit 21 keeps the relays RY1 and RY2 in an off-state. After the lapse of a specified time until the respective circuits become stable (e.g., 75 ms, which is taken until the respective circuits are sufficiently discharged after the electric current flows through the circuits), the voltage detection circuit 23 detects the voltages developed in the power feeding lines L and N extending between the relays RY1 and RY2 and the electric vehicle B (at the right side of the relays RY1 and RY2 in FIG. 4). If the voltage detection circuit 23 fails to detect the voltages when the relays RY1 and RY2 are in the off-state, the control circuit 21 determines that the relays RY1 and RY2 are operating properly (the contact points of each of the contact portions rpt and rpt are not adhered to each other) and transmits a guide signal (of, e.g., 12V) to the electric vehicle B via the signal line L1.

Responsive to the guide signal, the charging control unit 75 of the electric vehicle B sends either a permission signal (of, e.g., 6V in voltage) or a standby signal (of, e.g., 9V) back to the control circuit 21 through the signal line L1 (the permission and the standby signals are "CPLT signals"). The permission signal is sent if the battery 70 is in a rechargeable state and is permitted to be charged, but the standby signal is sent if the battery 70 is in a fully charged state and is not permitted to be charged. The guide signal sent from the control circuit 21 is returned back as it is (e.g., with the voltage of 12V unchanged) if the connector 61 is not connected to the connector 72 of the electric vehicle B. This enables the control circuit 21 to detect the disconnection of the connector 72.

Upon receiving the permission signal sent from the electric vehicle B, the control circuit 21 turns on the relays RY1 and RY2 to start supplying electric power to the electric vehicle B and turns on the power connection indication lamp. If the standby signal is received from the electric vehicle B or if the guide signal is returned back as it is, the control circuit 21 stops charging the battery 70 with the relays RY1 and RY2 and the power connection indication lamp being turned off. If the voltage detection circuit 23 detects voltages when the relays RY1 and RY2 are kept turned off, the control circuit 21 determines that the relays RY1 and RY2 suffer from adhesion. In this case, the control circuit 21 turns on the error indication lamp and transmits an error signal (of, e.g., −12V) to the electric vehicle B through the signal line L1.

While the battery 70 of the electric vehicle B is charged, the charging control unit 75 of the electric vehicle B continues to transmit the permission signal to the control circuit 21 which in turn keeps the relays RY1 and RY2 turned on. In the charging process, the ZCT and the leakage current detection circuit 22 performs detection of leakage current by comparing the current I1 flowing from the power source toward the electric vehicle B through the power feeding line L or N with the sum of the current I2 flowing from the electric vehicle B toward the power source through the power feeding line L or N and the current I3 flowing from the electric vehicle B toward the power source through the branch lines L2. In the event that current leakage occurs in the electric vehicle B, the current I1 is unbalanced with the sum of the currents I2 and I3, enabling the leakage current detection circuit 22 to detect the unbalanced current. If the unbalanced current is equal to or greater than a predetermined value, the leakage current detection circuit 22 determines that current leakage has occurred. In response thereto, the control circuit 21 turns off the relays RY1 and RY2, transmits an error signal to the electric vehicle B and turns on the error indication lamp. This makes it possible to prevent occurrence of electric shock accidents otherwise caused by the leakage current.

Upon completing the charging operation of the battery 70, the charging control unit 75 of the electric vehicle B transmits the standby signal to the control circuit 21, which then turns off the relays RY1 and RY2. The voltage detection circuit 23 then detects the voltage in the power feeding lines L and N to determine whether the contact portions rp1 and rp2 of the relays RY1 and RY2 suffer from adhesion problem. Further, the power connection indication lamp is turned off.

In the present embodiment, insertion portions inserted into the central opening of the ZCT are formed of the lead plates 55A and 56A, so that it becomes easy to pass through the central opening of the ZCT, as compared with the case where such insertion portions are formed of the lead lines. Further, the positions of the lead plates 55A and 56A can be fixed by the positioning portions. This makes it easy to assemble the components of the power feeding control apparatus. Further, the lead plates 55A and 56A are integrally formed with the metal plates (the terminal plates 55 and 56) constituting the power feeding lines L and N. This eliminates the need to provide the lead plates to be inserted into the central opening separately from the metal plates, so that the number of circuit components can be reduced. Further, it is possible to reduce the time required in welding the lead plates to the metal plates, which makes it easy to manufacture the power feeding control apparatus A.

Since the terminal block 5B and the ZCT are arranged in an overlapping relationship, it is possible to fit the terminal block 5B and the ZCT in a compact manner, which assists in reducing the size of the housing 1. There is a need to provide the relays RY1 and RY2 at the side of the power feeding control apparatus A closer to the electric vehicle B so that the control circuit 21 can operate even if the relays RY1 and RY2 are in an off-state. Since the relays RY1 and RY2 are arranged in an overlapping relationship with the terminal block 5A, it is possible to fit the relays RY1 and RY2 a compact manner, which assists in reducing the size of the housing 1.

Figure 15:
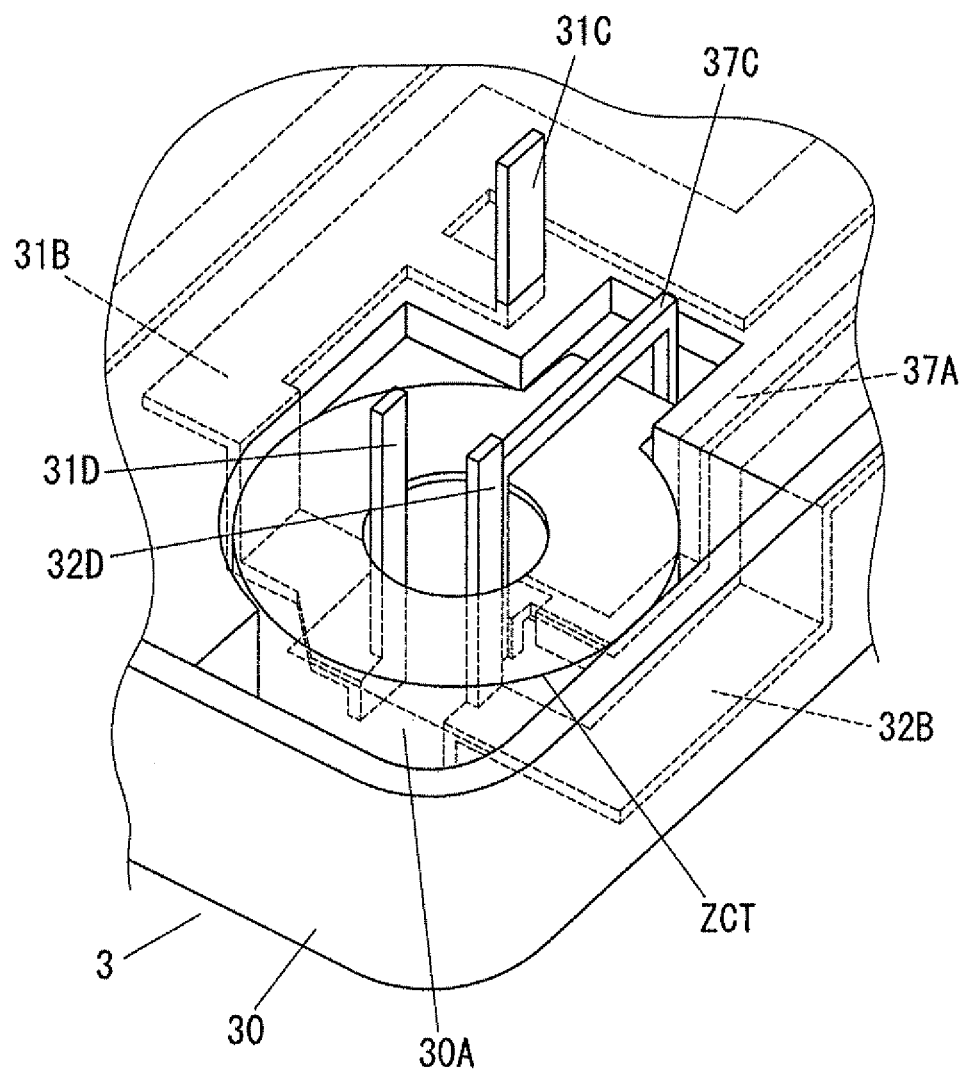
FIG. 15 is a perspective view illustrating an example in which parts of the bus bars constitute insertion portions inserted into the central opening of the zero current transformer.

In the embodiment described above, the lead plates 55A and 56A, which are integrally formed with the terminal plates 55 and 56 of the terminal block 5B, are inserted into the central opening of the ZCT. As an alternative example, a lead plate 31D formed by bending the tip end portion of the bus bar 31B and a lead plate 32D formed by bending the tip end portion of the bus bar 32B as illustrated in FIG. 15 can be inserted into the central opening of the ZCT. In this case also, there is no need to separately provide lead plates to be inserted into the central opening of the ZCT. This makes it easy to manufacture the power feeding control apparatus A. As in the embodiment set forth above, the positioning portions 80 is provided in the central opening of the ZCT, which makes it possible to fix the positions of the lead plates 31D and 32D. The tip end portions of the lead plates 31D and 32D are electrically connected to the terminal plates 55 and 56 by welding or the like.

Figure 11B:
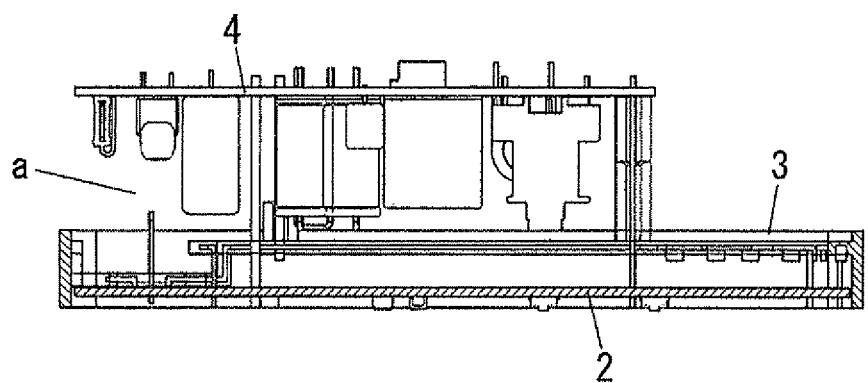
FIG. 11B is a side section view showing another examples in which the power supply PCB, the bus bar block and the control PCB are differently fixed together.

The power supply PCB 4 may be fixed to the bus bar block 3 such that the component mounting surface of the power supply PCB 4 faces toward the bus bar block 3 as shown in FIG. 11B. In this case, however, a dead space is generated as illustrated in FIG. 10B. This is because the components mounted to the power supply PCB 4 differ in height from one another. Further, the connection distance between the control PCB 2 and the power supply PCB 4 is increased.

While the invention has been shown and described with respect to the embodiments, it will be understood by those skilled in the art that various changes and modification may be made without departing from the scope of the invention as defined in the following claims.

What is claimed is:

1. A power feeding control apparatus for controlling electric power supplied from an external power source to an electric vehicle provided with a battery and a charging circuit for charging the battery, comprising:
   power feeding lines provided to supply the electric power from the external power source to the electric vehicle therethrough;
   a relay unit arranged on the power feeding lines to open and close the power feeding lines;
   a control circuit for controlling the relay unit;
   a leakage current detection circuit for detecting leakage current in the electric vehicle;
   a power supply circuit supplied with the electric power through the power feeding lines to generate a control electric power;
   a housing for accommodating at least the power feeding lines, the relay unit, the control circuit, the leakage current detection circuit and the power supply circuit;
   a power source side connector to be removably connected to a socket of the external power source; and
   a vehicle side connector to be removably connected to a power receiving connector of the electric vehicle,
   wherein the leakage current detection circuit includes a zero current transformer through which the power feeding lines extend and is configured to detect leakage current based on unbalanced currents flowing through the power feeding lines, wherein lead plates constitute a part of the power feeding lines, wherein the lead plates pass through a central opening of the zero current transformer, and wherein the zero current transformer includes a positioning member molded within the central opening to fix the positions of the lead plates.

2. The apparatus of claim 1, further comprising a power feeding line block provided separately from a board on which the power supply circuit is mounted and a board on which the control circuit is mounted and having metal plates constituting the power feeding lines, wherein the metal plates are insertion-molded in the power feeding line block, and wherein the lead plates are formed by having the metal plates, which are covered by a resin molding portion, partially protrude outwards beyond the resin molding portion.

3. The apparatus of claim 1, further comprising a terminal block, to which a power source side cable is removably connected, for providing electric connection between the power source side cable and the power feeding lines, wherein the terminal block includes terminal plates constitute the power feeding lines, and the lead plates are formed from parts of the terminal plates.

4. The apparatus of claim 2, further comprising an additional terminal block, to which a vehicle side cable is removably connected, for providing electric connection between the vehicle side cable and the power feeding lines, wherein the relay unit is arranged on the power feeding lines in an overlapping relationship with the additional terminal block, and wherein the additional terminal block is connected to the power feeding lines of the vehicle side, the power feeding lines being electrically connected to one end of contact portion of the relay unit.

5. The apparatus of claim 3, further comprising an additional terminal block, to which a vehicle side cable is removably connected, for providing electric connection between the vehicle side cable and the power feeding lines, wherein the relay unit is arranged on the power feeding lines in an overlapping relationship with the additional terminal block, and wherein the additional terminal block is connected to the power feeding lines of the vehicle side, the power feeding lines being electrically connected to one end of contact portion of the relay unit.

* * * * *